(12) United States Patent
Cho et al.

(10) Patent No.: US 7,750,378 B2
(45) Date of Patent: Jul. 6, 2010

(54) FIELD EFFECT TRANSISTOR AND METHOD OF FABRICATING THE SAME

(75) Inventors: Won-ju Cho, Daejeon (KR); Chang-geun Ahn, Daejeon (KR); Ki-ju Im, Daejeon (KR); Jong-heon Yang, Daejeon (KR); In-bok Baek, Daejeon (KR); Seong-jae Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/400,520

(22) Filed: Apr. 10, 2006

(65) Prior Publication Data

US 2006/0180867 A1   Aug. 17, 2006

Related U.S. Application Data

(62) Division of application No. 11/125,101, filed on May 10, 2005, now Pat. No. 7,060,580.

(51) Int. Cl.
  *H01L 29/78*   (2006.01)
(52) U.S. Cl. ............ 257/288; 257/347; 257/336; 257/344; 257/408; 257/412; 257/E29.242; 257/E19.266; 438/286; 438/190; 438/142; 438/149; 438/151
(58) Field of Classification Search ............ 257/347, 257/336, 408, 344, 288, 410–412, E29.242, 257/E19.266; 438/286, 190, 142, 149, 151, 438/197, 301
See application file for complete search history.

(56) References Cited

U.S. PATENT DOCUMENTS 4,949,140 A * 8/1990 Tam .................. 257/316
5,545,578 A * 8/1996 Park et al. ............ 438/303
5,793,089 A * 8/1998 Fulford et al. ........... 257/408
5,838,041 A * 11/1998 Sakagami et al. ........ 257/324
6,033,963 A    3/2000 Huang et al.
6,043,545 A * 3/2000 Tseng et al. ............ 257/408

(Continued)

OTHER PUBLICATIONS

Yang-Kyu Choi, et al.; "A Spacer Patterning Technology for Nanoscale CMOS"; IEEE Transaction on Electron Devices, vol. 49, No. 3, Mar. 2002; pp. 436-441.

(Continued)

*Primary Examiner*—Lynne A Gurley
*Assistant Examiner*—Meiya Li
(74) *Attorney, Agent, or Firm*—Lowe Hauptman Ham & Berner LLP

(57) ABSTRACT

Provided are a field effect transistor and a method of fabricating the same, wherein the field effect transistor is formed which has a hyperfine channel length by employing a technique for forming a sidewall spacer and adjusting the deposition thickness of a thin film. In the field effect transistor of the present invention, a source junction and a drain junction are thin, and the overlap between the source and the gate and between the drain and the gate is prevented, thereby lowering parasitic resistance. Further, the gate electric field is easily introduced to the drain extending region, so that the carrier concentration is effectively controlled in the channel at the drain. Also, the drain extending region is formed to be thinner than the source, so that the short channel characteristic is excellent.

9 Claims, 5 Drawing Sheets

U.S. PATENT DOCUMENTS

| | | | |
|---|---|---|---|
| 6,187,636 B1 * | 2/2001 | Jeong | 438/267 |
| 6,399,451 B1 * | 6/2002 | Lim et al. | 438/303 |
| 6,498,067 B1 * | 12/2002 | Perng et al. | 438/305 |
| 6,720,226 B2 * | 4/2004 | Segawa | 438/303 |
| 6,909,145 B2 * | 6/2005 | Cabral et al. | 257/336 |
| 6,933,620 B2 * | 8/2005 | Lunning et al. | 257/24 |
| 2002/0003272 A1 | 1/2002 | Gardner et al. | |
| 2003/0025135 A1 * | 2/2003 | Matsumoto et al. | 257/288 |
| 2003/0218214 A1 * | 11/2003 | Tsuchiya et al. | 257/350 |
| 2003/0219944 A1 * | 11/2003 | Kato et al. | 438/257 |
| 2004/0056304 A1 * | 3/2004 | Ahmed et al. | 257/336 |
| 2004/0164343 A1 * | 8/2004 | Tokui et al. | 257/317 |
| 2004/0232494 A1 * | 11/2004 | Nagano et al. | 257/382 |

OTHER PUBLICATIONS

A. Chatterjee, et al.; Sub 100nm Gate Length Metal Gate NMOS Transistors Fabricated by a Replacement Gate Process; IEDM 97; pp. 821-824.

* cited by examiner

FIELD EFFECT TRANSISTOR AND METHOD OF FABRICATING THE SAME

CROSS REFERENCE TO RELATED APPLICATION

This application is a divisional of U.S. Ser. No. 11/125,101, filed on May 10, 2005 now U.S. Pat. No. 7,060,580. This application, in its entirety, is incorporated herein by reference.

BACKGROUND OF THE INVENTION

1. Field of the Invention

The present invention relates to a field effect transistor and a method of fabricating the same, and more particularly, to a field effect transistor having a hyperfine channel length and an excellent electrical characteristic, and a method of fabricating the same.

2. Discussion of Related Art

In order to realize the high integration of a semiconductor device, technology for forming a fine pattern should be developed prior thereto. Currently, an E-beam lithography method, an extreme ultraviolet (EUV) exposure method, an X-ray exposure method, etc. are used for fabricating a channel of a nanometer scale, so that expensive equipment is needed. Therefore, production cost increases, and mass production is restricted.

As the semiconductor device is highly integrated, the performance thereof is deteriorated due to size reduction. In particular, in the case of a metal insulator semiconductor (MOS) device that occupies most of the semiconductor devices, there arise many problems because the channel length, the junction depth of a source and a drain, and the thickness of a gate insulating layer are decreased. That is, in the conventional semiconductor device, the source and the drain are formed by a self-aligning method after forming the gate insulating layer and a gate electrode. Hence, concentration and distribution of impurity ions contained in the source and the drain may not be freely adjusted, so that the conventional semiconductor device is susceptible to a short channel effect such as a drain induced barrier lowering (DIBL) effect, and an increase of a gate induced drain leakage current (GIDL) due to overlap between the gate and the source or between the gate and the drain when the length of the gate is reduced. Further, an annealing process for activating impurity ions injected into the source and the drain is performed in the state that the gate insulating layer is formed, so that temperature adjustment for the annealing process is restricted.

To solve these problems, there has been recently proposed a replacement gate structure. However, a fabrication process thereof is very complicated, and there is a difficulty in forming the source and the drain using the self-aligning method. Accordingly, there is needed a new fabrication method which can solve the foregoing problems and fabricate a semiconductor device having high integration density and high performance.

SUMMARY OF THE INVENTION

The present invention is directed to a field effect transistor having a hyperfine channel length and an excellent electrical characteristic.

The present invention is also directed to a method of fabricating a field effect transistor, which can solve problems in performance and fabrication due to high integration.

The forgoing and/or other aspects of the present invention are achieved by providing a field effect transistor comprising: a substrate; a gate electrode formed on the substrate, and insulated from the substrate by a gate insulating layer; a source layer formed on the substrate at one side of the gate electrode; a drain layer formed on the substrate at the other side of the gate electrode; a first insulating layer formed between the gate electrode and the source layer; second and third insulating layers formed between the gate electrode and the drain layer; a source junction formed on the substrate beneath the first insulating layer and the source layer; a drain junction formed on the substrate beneath the drain layer; and an extending region formed to be thinner than the drain junction and formed in the substrate beneath the second insulating layer.

Another aspects of the present invention are achieved by providing a method of fabricating a field effect transistor, comprising: forming a doped poly silicon pattern on a substrate; forming a first insulating layer spacer on a sidewall of the poly silicon pattern; forming a source junction in the substrate beneath both the poly silicon pattern and the first insulating layer spacer by diffusing impurity ions doped in the poly silicon pattern; forming a gate insulating layer on an entire surface of the structure; forming a conductive layer spacer on the gate insulating layer at a sidewall of the first insulating layer spacer; forming a second insulating layer spacer on a sidewall of the conductive layer spacer; forming a third insulating layer spacer on a sidewall of the second insulating layer spacer; forming a drain extending region beneath the third insulating layer spacer and in an exposed region of the substrate; forming a gate electrode formed of the conductive layer spacer, a source layer formed of the poly silicon pattern, and a drain layer formed of the poly silicon layer after forming and planarizing the doped poly silicon layer on an entire surface of the structure; and forming a drain junction in the substrate by diffusing impurity ions doped in the drain layer downward.

The substrate may be formed of a bulk silicon substrate or an SOI substrate. Further, the first insulating layer spacer and the third insulating layer spacer may be formed of oxide layers, and the second insulating layer spacer may be formed of a high dielectric insulating layer.

The drain extending region may be formed by an ion implantation process. Further, the drain junction may be formed to be thinner than the source junction.

BRIEF DESCRIPTION OF THE DRAWINGS

The above and other features of the present invention will be described in reference to certain exemplary embodiments thereof with reference to the attached drawings in which.

DETAILED DESCRIPTION OF PREFERRED EMBODIMENTS

In order to realize a hyperfine channel length of a nanometer scale, there is required a very strict processing condition, and the conventional photolithography process cannot be applied anymore. Therefore, an E-beam lithography method, an extreme ultraviolet (EUV) exposure method, an X-ray exposure method, etc. should be employed. Also, in the case of a general single crystal silicon substrate, it is difficult to form a thin junction of a source and a drain, and a significant electrical problem arises as doping concentration of impurity ions increases.

In order to solve these problems, a field effect transistor having a hyperfine channel length is formed using a sidewall spacer and adjusting the deposition thickness of a thin film. Here, the conventional fabrication method is still used to form a hyperfine pattern without using expensive lithography and processing equipment. Therefore, a highly integrated semiconductor device can be fabricated with reduced production cost without an additional investment in processing equipment and facilities.

Hereinafter, preferable embodiments according to the present invention will be described with reference to the accompanying drawings, wherein the preferred embodiments of the present invention are provided to be readily understood by those skilled in the art.

Figure 1:
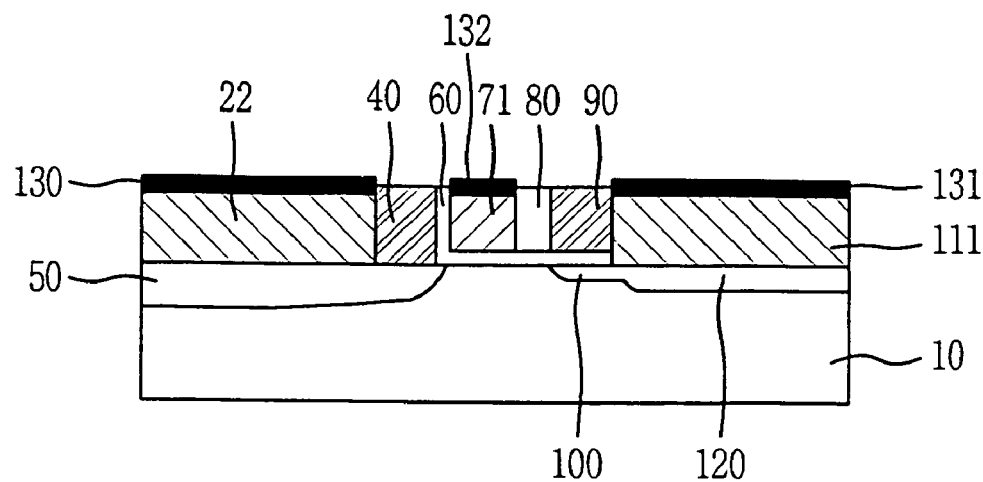
FIG. 1 is a cross-sectional view of a field effect transistor according to an embodiment of the present invention.

FIG. 1 is a cross-sectional view of a field effect transistor according to an embodiment of the present invention.

A gate electrode 71 is formed on a bulk silicon or silicon-on-insulator (SOI) substrate 10, which is electrically insulated by a gate insulating layer 60 from the substrate 10. Further, a source layer 22 is formed on one side of the substrate 10 and a drain layer 111 is formed on the other side of the substrate 10. Here, the source layer 22 and the drain layer 111 are formed of doped poly silicon.

An oxide layer 40 is formed between the gate electrode 71 and the source layer 22, and an insulating layer 80 and an oxide layer 90 are formed between the gate electrode 71 and the drain layer 111. Further, a source junction 50 is formed in the substrate 10 beneath both the insulating layer 40 and the source layer 22, a drain junction 120 thinner than the source junction 50 is formed in the substrate 10 beneath the drain layer 111, and a drain extending region 100 thinner than the drain junction 120 is formed in the substrate 10 beneath the insulating layer 80.

With this configuration, a method of fabricating a field effect transistor according to an embodiment of the present invention will be described hereinbelow with reference to FIGS. 2A through 2M.

Figure 2A:
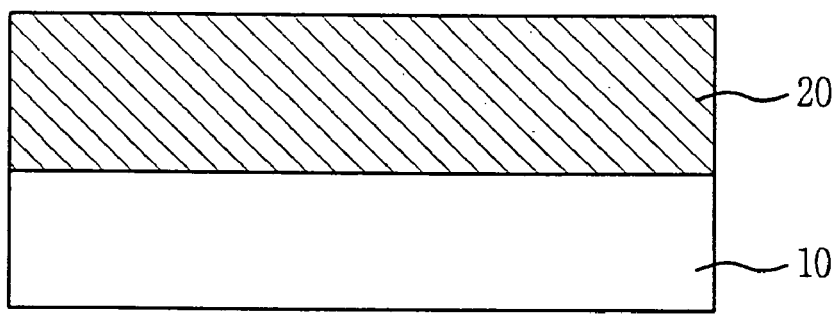
FIGS. 2A through 2M are cross-sectional views for explaining a method of fabricating a field effect transistor according to an embodiment of the present invention.

Referring to FIG. 2A, a highly doped poly silicon layer 20 containing an N- or P-type impurity such as phosphorous, boron, arsenic, etc. is formed on the substrate 10. Here, the substrate 10 is formed of a bulk silicon substrate or an SOI substrate having a stacked structure of a single crystal silicon layer, a buried oxide layer, and a single crystal silicon layer. Further, the poly silicon layer 20 is formed by a chemical vapor deposition (CVD) method or a physical vapor deposition (PVD) method. Besides, the poly silicon layer 20 can be formed by directly depositing doped poly silicon, or doping the poly silicon with ions in an in-situ process after depositing the poly silicon.

Figure 2B:
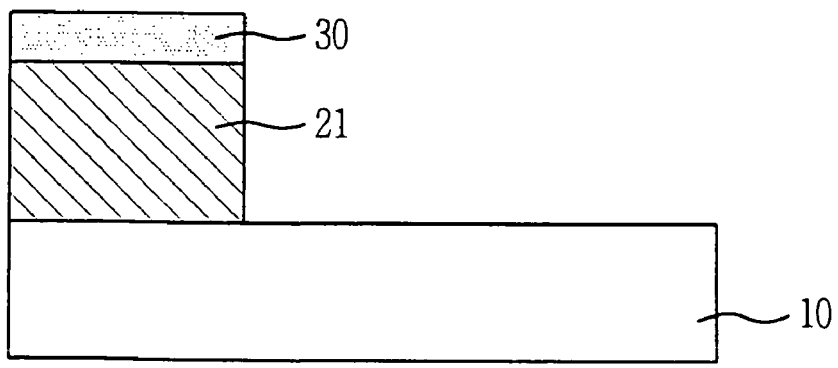

Referring to FIG. 2B, a photoresist 30 is formed on the poly silicon layer 20 and then patterned. Then, the poly silicon layer 20 is anisotropically etched using the patterned photoresist 30 as a mask, and the remaining photoresist 30 is removed, thereby forming a poly silicon pattern 21. Here, the anisotropic etching process is a dry etching process having a high etch selectivity with regard to the substrate 10, and a reactive ion etch (RIE) process can be used as the anisotropic etching process.

Figure 2C:
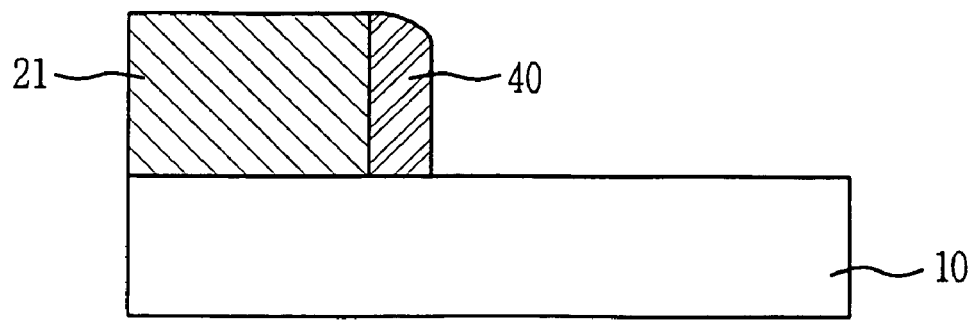

Referring to FIG. 2C, an oxide layer is deposited on the entire surface of the substrate 10 including the poly silicon pattern 21, and then anisotropically etched to form an oxide layer spacer 40 on a sidewall of the poly silicon pattern 21.

Figure 2D:
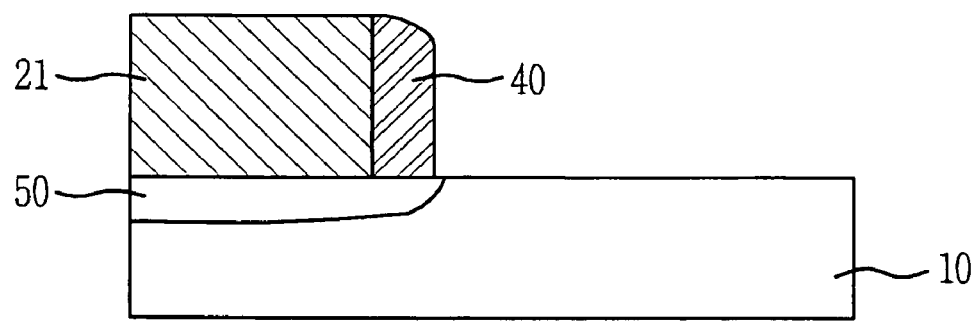

Referring to FIG. 2D, an annealing process is performed to diffuse the impurity ions doped in the poly silicon pattern 21 into the substrate 10. Due to the diffusion of the impurity ions, a source junction 50 is formed to a predetermined depth on the substrate 10 beneath both the poly silicon pattern 21 and the oxide layer spacer 40. Here, the deposition thickness of the oxide layer for forming the oxide layer spacer 40, and the annealing temperature for forming the source junction 50 are determined in consideration of overlap between the source junction 50 and a gate electrode to be formed, an operating characteristic of the device, etc.

Figure 2E:
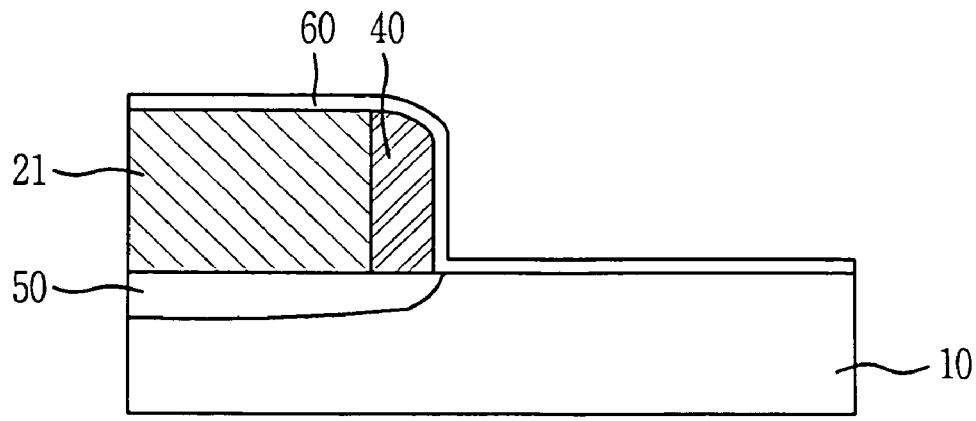

Referring to FIG. 2E, a gate insulating layer 60 with a high dielectric constant is formed on the entire surface of the structure. The high dielectric gate insulating layer 60 can include aluminum oxide ($Al_2O_3$) which has a dielectric constant of about 10; $ZrSi_xO_y$, $HfSi_xO_y$, $HfAl_xO_y$, $LaSi_xO_y$, $ZrAl_xO_y$, or $ZrN_xO_y$, which has a dielectric constant ranging from 10 to 20; $ZrO_2$, $HfO_2$, $La_2O_3$, or $Pr_2O_3$, which has a dielectric constant ranging from 15 to 30; $Ta_2O_5$ which has a dielectric constant ranging from 20 to 30; and a compound thereof. The thickness of the gate insulating layer 60 is determined to have an effective oxide thickness (EOT) of 1 nm or below in consideration of the dielectric constant of each material.

Figure 2F:
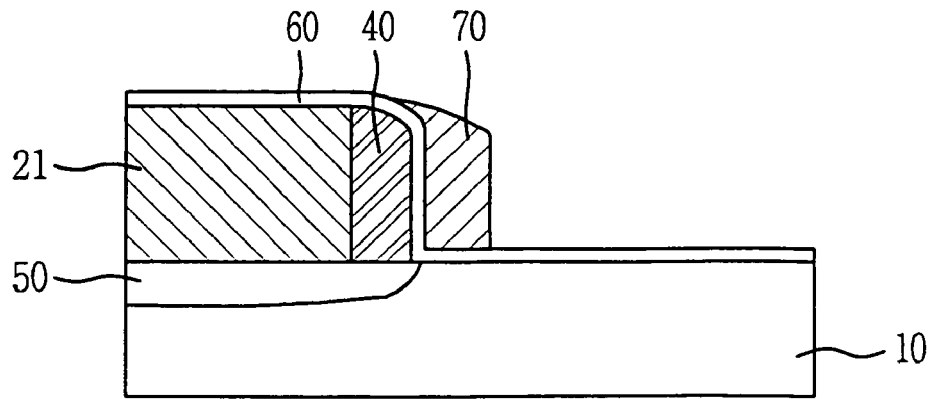

Referring to FIG. 2F, a conductive layer is deposited on the gate insulating layer 60, and then anisotropically etched to form a conductive layer spacer 70 on the gate insulating layer 60 adjacent to the sidewall of the oxide layer spacer 40. At this time, the length of the conductive layer spacer 70 can be adjusted depending on the deposition thickness of the conductive layer. Here, the conductive layer can include poly silicon, doped poly silicon, metal, etc.

Figure 2G:
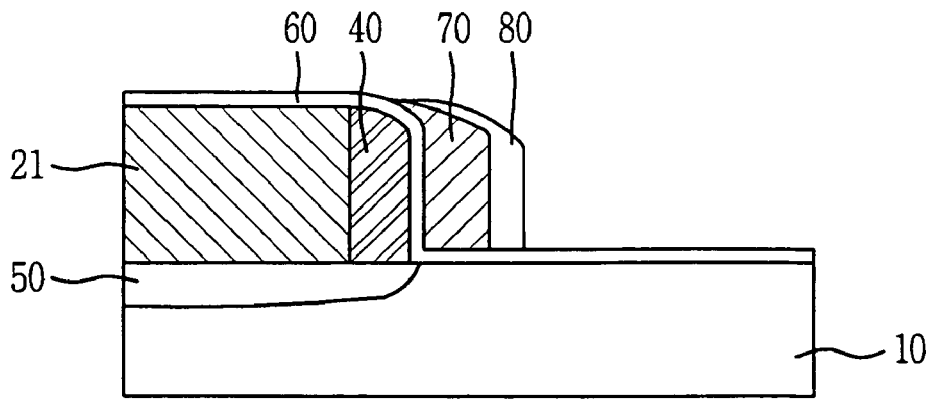

Referring to FIG. 2G, an insulating layer having a high dielectric constant (High-k) is deposited on the entire surface of the structure, and then anisotropically etched to form a high dielectric insulating layer spacer 80 for forming drain offset on the sidewall of the conductive layer spacer 70a. The high dielectric gate insulating layer 80 can include $Al_2O_3$ which has a dielectric constant of 10; $ZrSi_xO_y$, $HfSi_xO_y$, $HfAl_xO_y$, $LaSi_xO_y$, $ZrAl_xO_y$, or $ZrN_xO_y$, which has a dielectric constant ranging from 10 to 20; $ZrO_2$, $HfO_2$, $La_2O_3$, or $Pr_2O_3$, which has a dielectric constant ranging from 15 to 30; $Ta_2O_5$ which has a dielectric constant ranging from 20 to 30; and a compound thereof. Preferably, the high dielectric insulating layer 80 is formed to a thickness of 50 nm or below.

Figure 2H:
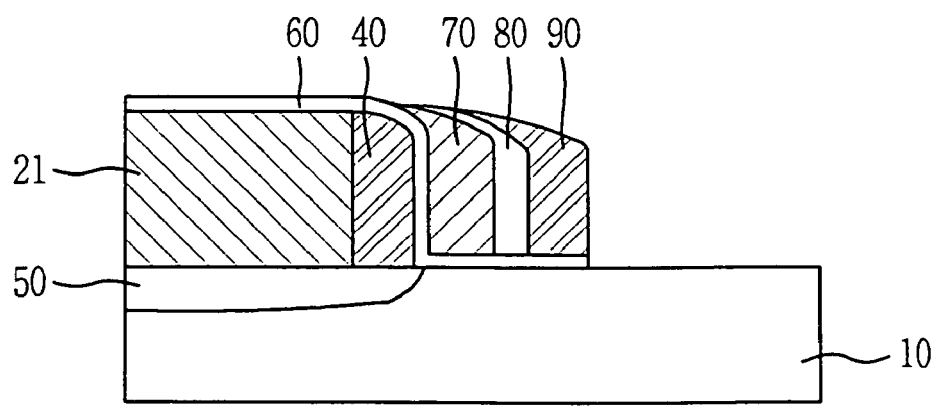

Referring to FIG. 2H, a silicon oxide layer is deposited on the entire surface of the structure, and then anisotropically etched to from an oxide layer spacer 90 on a sidewall of the insulating layer spacer 80.

Figure 2I:
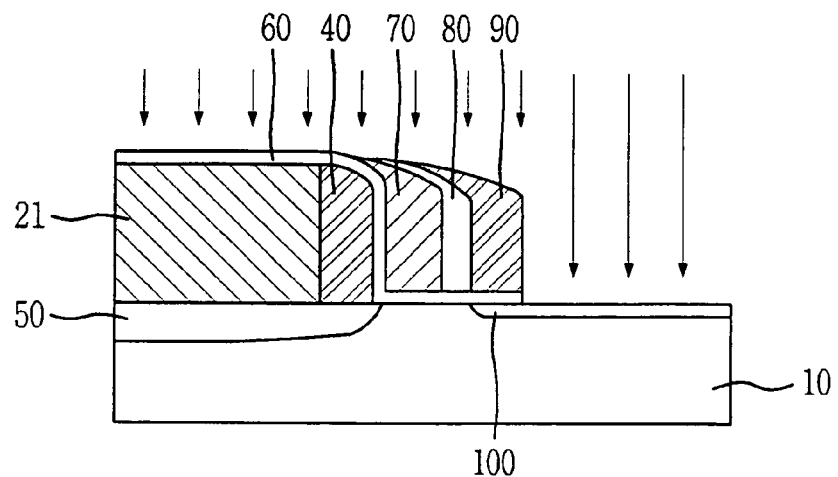

Referring to FIG. 2I, an ion implantation process is performed to form a drain extending region 100 to a predetermined depth on the exposed surface of the substrate and beneath the oxide layer spacer 90.

Figure 2J:
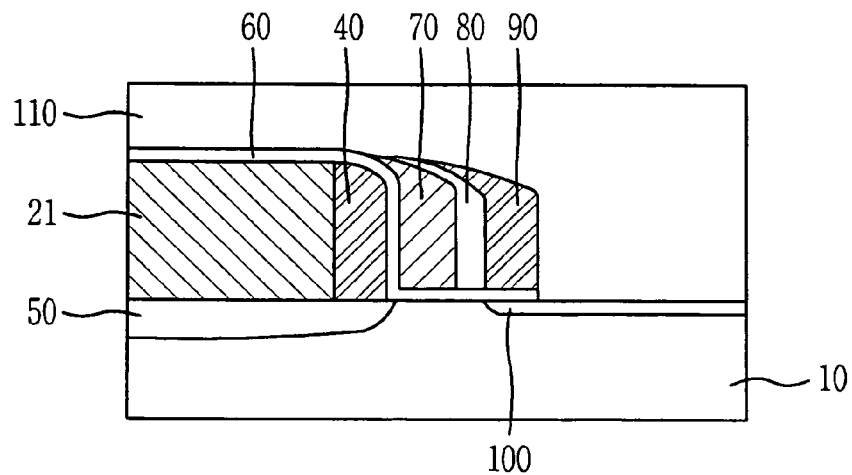

Referring to FIG. 2J, a highly doped poly silicon layer 110 containing an N- or P-type impurity ion such as phosphorous, boron, arsenic, etc. is formed on the entire surface of the structure.

Figure 2K:
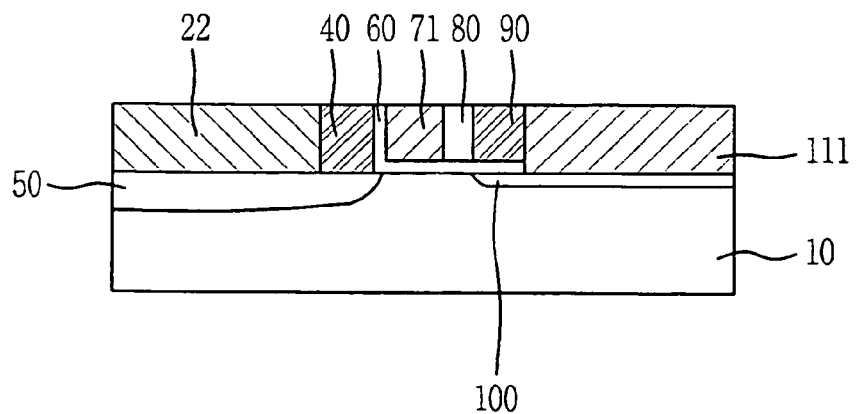

Referring to FIG. 2K, a chemical-mechanical polishing (CMP) process is performed to polish partial surfaces of the poly silicon layer 110, the gate insulating layer 60, the poly silicon pattern 21, the oxide layer spacer 40, the conductive layer spacer 70, the insulating layer spacer 80, and the oxide layer spacer 90, thereby planarizing the surfaces thereof. After this planarizing process, a source layer 22 consisted of the poly silicon pattern 21 and a drain layer 111 consisted of the poly silicon layer 110 are formed at opposite lateral sides of the gate electrode 71 consisted of the conductive layer spacer 70, thereby completing an elevated source/drain structure.

Figure 2L:
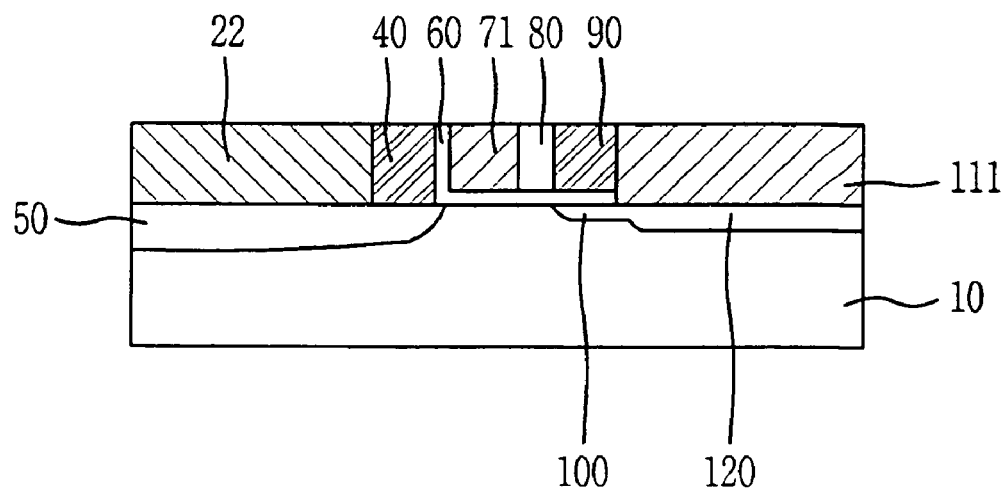

Referring to FIG. 2L, a low temperature annealing process is performed to activate the impurity ions of the drain extending region 100, and at the same time to diffuse the impurity ions contained in the drain layer 111 into the substrate 10, thereby forming a highly doped drain junction 120 in the substrate 10 beneath the drain layer 111.

Figure 2M:
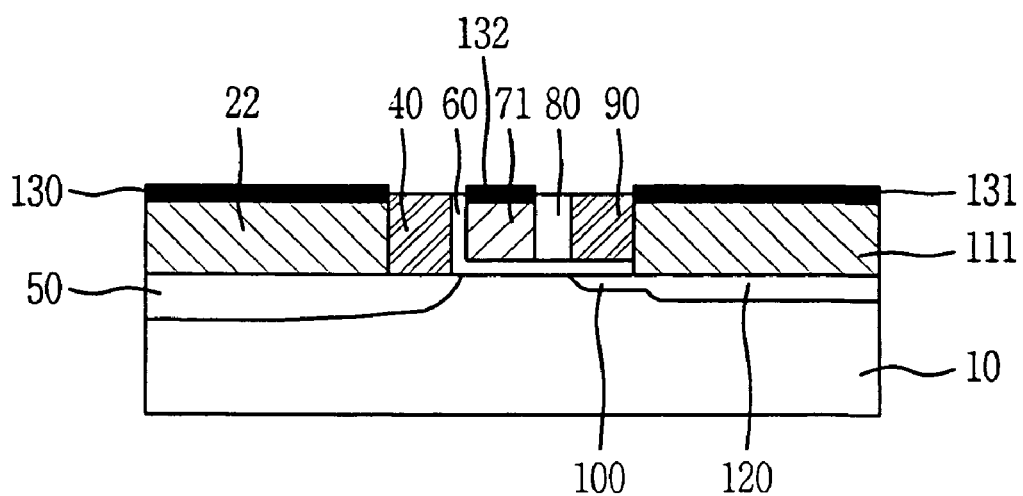

Referring to FIG. 2M, a metal is deposited on the entire surface of the structure and then annealed to reduce contact resistance, thereby selectively forming silicide layers 130, 131 and 132 on surfaces of the source layer 21, the drain layer 111, and the gate electrode 70.

Then, an interlayer insulating layer is formed like a general device fabrication process, and then a contact hole is formed on the interlayer insulating layer, thereby forming interconnections connected to the source layer, the drain layer, and the gate electrode.

As described above, the present invention employs a technique for forming a sidewall spacer, so that a hyperfine pattern with a nanometer scale can be easily formed without using expensive equipment. The fabrication process according to an embodiment of the present invention allows the field effect transistor to have the following characteristics.

First, the impurity ions doped in the poly silicon pattern 21 and the poly silicon layer 110 are diffused to form the thin source junction 50 and the thin drain junction 120, respectively, thereby decreasing parasitic resistance. Through the diffusion of the impurity ions, the annealing temperature can be lowered, and the concentration and the distribution of the impurity ions can be freely controlled. In particular, it is possible to control the distribution of the impurity ions contained in the drain junction 120 on which an electric field is concentrated, so that a short channel effect is prevented and power consumption is decreased.

Second, the oxide layer spacer 40 between the gate electrode 71 and the source layer 22 prevents the source junction 50 and the gate electrode 71 from overlapping each other, thereby decreasing parasitic capacity and preventing the short channel effect due to excessive lateral diffusion of the impurity ions.

Third, the insulating layer spacer 80 between the gate electrode 71 and the drain layer 111 prevents the drain junction 120 and the gate electrode 71 from overlapping each other, thereby decreasing parasitic capacity. Further, the insulating layer spacer 80 is formed of a high dielectric insulating layer, so that a gate field effect in the drain extending region 100 is improved, and thus carrier concentration can be effectively controlled in the channel at the drain junction 120. That is, an inversion region is more easily formed in the drain at the same gate voltage.

Fourth, the drain extending region 100 is formed to be thinner than the source junction 50, thereby effectively controlling a short channel characteristic.

Fifth, because there is no source extending region, the decreased channel resistance enhances operating performance of the device, and the device can have good electrical characteristics due to the short channel.

As described above, a field effect transistor is formed which has a hyperfine channel length by employing a technique for forming a sidewall spacer and adjusting the deposition thickness of a thin film. Here, the conventional fabrication method is still used to form a hyperfine pattern without using expensive lithography and processing equipment. Therefore, the highly integrated semiconductor device can be fabricated by reduced production cost without an additional investment in processing equipment and facilities.

In the field effect transistor according to the present invention, the source junction and the drain junction are thin, and the overlap between the source and the gate and between the drain and the gate is prevented, thereby lowering parasitic resistance. Further, the gate electric field is easily introduced to the drain extending region, so that the carrier concentration is effectively controlled in the channel at the drain. Also, the drain extending region is thinner than the source, so that the short channel characteristic is excellent.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A field effect transistor comprising:
a substrate;
a gate electrode on the substrate;
an asymmetrical L-shaped gate insulating layer, the gate insulating layer consisting of a first portion which extends between a lower side of the gate electrode and the substrate, and a contiguous second portion which extends up along a first side of the gate electrode;
a source layer on the substrate at one side of the gate electrode;
a drain layer on the substrate at the other side of the gate electrode;
a first insulating layer between a) the second portion of the gate insulating layer and b) the source layer;
second and third insulating layers between the gate electrode and the drain layer the second insulating layer being disposed against a second side of the gate electrode, and the third insulating layer being disposed against a side of the drain layer and a side of the second insulating layer;
a source junction on the substrate beneath the first insulating layer and the source layer;
a drain junction on the substrate beneath the drain layer; and
an extending region configured as part of the drain junction and configured to be thinner than a main portion of the drain junction and formed in the substrate beneath the third insulating layer, the first portion of the gate insulating layer separating the extending region and the third insulating layer wherein the L-shaped gate insulating layer which has a different material than the first, second, and third insulating layers.

2. The field effect transistor according to claim 1, wherein the substrate includes any one of a bulk silicon substrate and a silicon on insulator (SOI) substrate.

3. The field effect transistor according to claim 1, wherein the source and drain layers are formed of doped poly silicon layers.

4. The field effect transistor according to claim 1, wherein the first and third insulating layers are formed of oxide layers, and the second insulating layer is formed of a high dielectric insulating layer.

5. The field effect transistor according to claim 4, wherein the high dielectric insulating layer is formed of one selected from a group consisting of $Al_2O_3$, $ZrSi_xO_y$, $HfSi_xO_y$, $HfAl_xO_y$, $LaSi_xO_y$, $ZrAl_xO_y$, $ZrN_xO_y$, $ZrO_2$, $HfO_2$, $La_2O_3$, $Pr_2O_3$, $Ta_2O_5$, and a compound thereof.

6. The field effect transistor according to claim 1, wherein the second insulating layer is thicker than the second portion of the gate insulating layer.

7. The field effect transistor according to claim 1, wherein the source junction extends deeper into the substrate than the drain junction so as to be thicker than the drain junction.

8. The field effect transistor according to claim 1, wherein the second and third insulating layers are located side by side and on top of the gate insulating layer.

9. A field effect transistor comprises:
a substrate;
a gate electrode on the substrate;
an asymmetrical L-shaped gate insulating layer, the gate insulating layer consisting of a first portion which extends between a lower side of the gate electrode and the substrate, and a contiguous second portion which extends up along a first side of the gate electrode;
a source layer on the substrate at one side of the gate electrode;
a drain layer on the substrate at the other side of the gate electrode;
a first insulating layer between a) the second portion of the gate insulating layer and b) the source layer;
second and third insulating layers between the gate electrode and the drain layer the second insulating layer being disposed against a second side of the gate electrode, and the third insulating layer being disposed against a side of the drain layer and a side of the second insulating layer, the second insulating layer being different from the third insulating layer and comprising at least of one of $Al_2O_3$, $ZrSi_xO_y$, $HfSi_xO_y$, $HfAl_xO_y$, $LaSi_xO_y$, $ZrAl_xO_y$, $ZrN_xO_y$, $ZrO_2$, $HfO_2$, $La_2O_3$, $Pr_2O_3$, $Ta_2O_5$, and a compound thereof;
a source junction on the substrate beneath the first insulating layer and the source layer;
a drain junction on the substrate beneath the drain layer; and
an extending region configured as part of the drain junction and configured to be thinner than a main portion of the drain junction and formed in the substrate beneath the third insulating layer, the first portion of the gate insulating layer separating the extending region and the third insulating layer wherein the L-shaped gate insulating layer which has a different material than the first, second, and third insulating layers.

* * * * *